United States Patent [19]

Hardwick et al.

[11] Patent Number: 5,226,084

[45] Date of Patent: Jul. 6, 1993

[54] METHODS FOR SPEECH QUANTIZATION AND ERROR CORRECTION

[75] Inventors: John C. Hardwick, Cambridge; Jae S. Lim, Winchester, both of Mass.

[73] Assignee: Digital Voice Systems, Inc., Cambridge, Mass.

[21] Appl. No.: 624,878

[22] Filed: Dec. 5, 1990

[51] Int. Cl.$^5$ .......................... G10L 5/00; G10L 3/00; G10L 5/02; G06F 11/00

[52] U.S. Cl. ..................................... 381/41; 381/31; 381/36; 381/37; 381/46; 381/50; 381/51; 381/5.1; 381/5.2

[58] Field of Search .................................. 381/29–41, 381/46–51; 371/5.1, 5.2

[56] References Cited

U.S. PATENT DOCUMENTS

| | | | |
|---|---|---|---|
| 3,975,587 | 8/1976 | Dunn et al. | 381/40 |
| 3,982,070 | 9/1976 | Flanagan | 179/1 |
| 3,995,116 | 11/1976 | Flanagan | 179/1 |
| 4,276,647 | 6/1981 | Thacker et al. | 371/40 |
| 4,720,861 | 1/1988 | Bertrand | 381/36 |
| 4,797,926 | 1/1989 | Bronson et al. | 381/37 |
| 4,856,068 | 8/1989 | Quatieri et al. | 381/47 |
| 4,873,689 | 10/1989 | Pellerin | 371/37.1 |
| 4,885,790 | 12/1989 | McAulay et al. | 381/36 |
| 5,023,910 | 6/1991 | Thomson | 381/37 |

OTHER PUBLICATIONS

Griffin, et al., "A New Pitch Detection Algorithm", Digital Signal Processing, No. 84, pp. 395–399.

Griffin, et al., "A New Model-Based Speech Analysis/Synthesis System", IEEE International Conference on Acoustics, Speech, and Signal Processing, ICASSP 1985, pp. 513–516.

McAulay, et al., "Mid-Rate Coding Based on a Sinusoidal Representation of Speech", IEEE 1985, pp. 945–948.

McAulay, et al., "Computationally Efficient Sine–Wave Synthesis and Its Application to Sinusoidal Transform Coding", IEEE 1988, pp. 370–373.

Hardwick, "A 4.8 Kbps Multi-Band Excitation Speech Coder", Thesis for Degree of Master of Science in Electrical Engineering and Computer Science, Massachusetts Institute of Technology, May 1988.

Griffin, "Multi-Band Excitation Vocoder", Thesis for Degree of Doctor of Philosophy, Massachusetts Institute of Technology, Feb. 1987.

Portnoff, "Short-Time Fourier Analysis of Sampled Speech", IEEE Transactions on Acoustics, Speech, and Signal Processing, vol. ASSP-29, No. 3, Jun. 1981, pp. 324–333.

Griffin, et al., "Signal Estimation from Modified Short-Time Fourier Transform", IEEE Transactions on Acoustics, Speech, and Signal Processing, vol. ASSP-32, No. 2, Apr. 1984, pp. 236–243.

(List continued on next page.)

Primary Examiner—Robert L. Richardson
Assistant Examiner—Kee M. Tung
Attorney, Agent, or Firm—Fish & Richardson

[57] ABSTRACT

The redundancy contained within the spectral amplitudes is reduced, and as a result the quantization of the spectral amplitudes is improved. The prediction of the spectral amplitudes of the current segment from the spectral amplitudes of the previous is adjusted to account for any change in the fundamental frequency between the two segments. The spectral amplitudes prediction residuals are divided into a fixed number of blocks each containing approximately the same number of elements. A prediction residual block average (PRBA) vector is formed; each element of the PRBA is equal to the average of the prediction residuals within one of the blocks. The PRBA vector is vector quantized, or it is transformed with a Discrete Cosine Transform (DCT) and scalar quantized. The perceived effect of bit errors is reduced by smoothing the voiced/unvoiced decisions. An estimate of the error rate is made by locally averaging the number of correctable bit errors within each segment. If the estimate of the error rate is greater than a threshold, then high energy spectral amplitudes are declared voiced.

25 Claims, 7 Drawing Sheets

OTHER PUBLICATIONS

Almeida, et al., "Harmonic Coding: A Low Bit-Rate, Good-Quality Speech Coding Technique", IEEE (1982) CH1746/7/82, pp. 1664-1667.

Quatieri, et al., "Speech Transformations Based on a Sinusoidal Representation", IEEE Transactions on Acoustics, Speech, and Signal Processing, vol. AS-SP-34, No. 6, Dec. 1986, pp. 1449-1464.

Griffin, et al., "Multiband Excitation Vocoder", IEEE Transactions on Acoustics, Speech, and Signal Processing, vol. 36, No. 8, Aug., 1988, pp. 1223-1235.

Almeida, et al., "Variable-Frequency Synthesis: An Improved Harmonic Coding Scheme", ICASSP 1984, pp. 27.5.1-27.5.4.

Flanagan, J. L., Speech Analysis Synthesis and Perception, Springer-Verlag, 1982, pp. 378-386.

METHODS FOR SPEECH QUANTIZATION AND ERROR CORRECTION

BACKGROUND OF THE INVENTION

This invention relates to methods for quantizing speech and for preserving the quality of speech during the presence of bit errors.

Relevant publications include: J. L. Flanagan, *Speech Analysis, Synthesis and Perception*, Springer-Verlag, 1972, pp. 378-386, (discusses phase vocoder—frequency-based speech analysis-synthesis system); Quatieri, et al., "Speech Transformations Based on a Sinusoidal Representation", IEEE TASSP, Vol, ASSP34, No. 6. Dec. 1986, pp. 1449-1986, (discusses analysis-synthesis technique based on a sinusoidal representation); Griffin, "Multiband Excitation Vocoder", Ph.D. Thesis, M.I.T., 1987, (discusses an 8000 bps Multi-Band Excitation speech coder); Griffin, et al., "A High Quality 9.6 kbps Speech Coding System", Proc. ICASSP 86, pp. 125-128, Tokyo, Japan, Apr. 13-20, 1986, (discusses a 9600 bps Multi-Band Excitation speech coder); Griffin, et al., "A New Model-Based Speech Analysis/Synthesis System", Proc. ICASSP 85, pp. 513-516, Tampa, Fla., Mar. 26-29, 1985, (discusses Multi-Band Excitation speech model); Hardwick, "A 4.8 kbps Multi-Band Excitation Speech Coder", S. M. Thesis, M.I.T., May 1988, (discusses a 4800 bps Multi-Band Excitation speech coder); McAulay et al., "Mid-Rate Coding Based on a Sinusoidal Representation of Speech", Proc. ICASSP 85, pp. 945-948, Tampa, Fla., Mar. 26-29, 1985, (discusses speech coding based on a sinusoidal representation); Campbell et al., "The New 4800 bps Voice Coding Standard", Mil Speech Tech Conference, Nov. 1989, (discusses error correction in low rate speech coders); Campbell et al., "CELP Coding for Land Mobile Radio Applications", Proc. ICASSP 90, pp. 465-468, Albequerque, N.M. Apr. 3-6, 1990, (discusses error correction in low rate speech coders); Levesque et al., *Error-Control Techniques for Digital Communication*, Wiley, 1985, pp. 157-170, (discusses error correction in general); Jayant et al., *Digital Coding of Waveforms*, Prentice-Hall, 1984 (discusses quantization in general); Makhoul, et.al. "Vector Quantization in Speech Coding", Proc. IEEE, 1985, pp. 1551-1558 (discusses vector quantization in general). The contents of these publications are incorporated herein by reference.

The problem of speech coding (compressing speech into a small number of bits) has a large number of applications, and as a result has received considerable attention in the literature. One class of speech coders (vocoders) which have been extensively studied and used in practice is based on an underlying model of speech. Examples from this class of vocoders include linear prediction vocoders, homomorphic vocoders, and channel vocoders. In these vocoders, speech is modeled on a short-time basis as the response of a linear system excited by a periodic impulse train for voiced sounds or random noise for unvoiced sounds. For this class of vocodes, speech is analyzed by first segmenting speech using a window such as a Hamming window. Then, for each segment of speech, the excitation parameters and system parameters are estimated and quantized. The excitation parameters consist of the voiced/unvoiced decision and the pitch period. The system parameters consist of the spectral envelope or the impulse response of the system. In order to reconstruct speech, the quantized excitation parameters are used to synthesize an excitation signal consisting of a periodic impulse train in voiced regions or random noise in unvoiced regions. This excitation signal is then filtered using the quantized system parameters.

Even though vocoders based on this underlying speech model have been quite successful in producing intelligible speech, they have not been successful in producing high-quality speech. As a consequence, they have not been widely used for high-quality speech coding. The poor quality of the reconstructed speech is in part due to the inaccurate estimation of the model parameters and in part due to limitations in the speech model.

A new speech model, referred to as the Multi-Band Excitation (MBE) speech model, was developed by Griffin and Lim in 1984. Speech coders based on this new speech model were developed by Griffin and Lim in 1986, and they were shown to be capable of producing high quality speech at rates above 8000 bps (bits per second). Subsequent work by Hardwick and Lim produced a 4800 bps MBE speech coder which was also capable of producing high quality speech. This 4800 bps speech coder used more sophisticated quantization techniques to achieve similar quality at 4800 bps that earlier MBE speech codes had achieved at 8000 bps.

The 4800 bps MBE speech coder used a MBE analysis/synthesis system to estimate the MBE speech model parameters and to synthesize speech from the estimated MBE speech model parameters. A discrete speech signal, denoted by s(n), is obtained by sampling an analog speech signal. This is typically done at an 8 kHz, sampling rate, although other sampling rates can easily be accommodated through a straightforward change in the various system parameters. The system divides the discrete speech signal into small overlapping segments or segments by multiplying s(n) with a window w(n) (such as a Hamming window or a Kaiser window) to obtain a windowed signal $s_w(n)$. Each speech segment is then analyzed to obtain a set of MBE speech model parameters which characterized that segment. The MBE speech model parameters consist of a fundamental frequency, which is equivalent to the pitch period, a set of voiced/unvoiced decisions, a set of spectral amplitudes, and optionally a set of spectral phases. These model parameters are than quantized using a fixed number of bits for each segment. The resulting bits can then be used to reconstruct the speech signal, by first reconstructing the MBE model parameters from the bits and then synthesizing the speech from the model parameters. A block diagram of a typical MBE speech coder is shown in FIG. 1.

The 4800 bps MBE speech coder required the use of a sophisticated technique to quantize the spectral amplitudes. For each speech segment the number of bits which could be used to quantize the spectral amplitudes varied between 50 and 125 bits. In addition the number of spectral amplitudes for each segment varies between 9 and 60. A quantization method was devised which could efficiently represent all of the spectral amplitudes with the number of bits available for each segment. Although this spectral amplitude quantization method was designed for use in an MBE speech coder the quantization techniques are equally useful in a number of different speech coding methods, such as the Sinusoidal Transform Coder and the Harmonic Coder. For a particular speech segment, L denotes the number of spectral amplitudes in that segment. The value of $\hat{L}$ is derived from the fundamental frequency, $\hat{\omega}_0$, according to the relationship.

$$\hat{L} = \left[ \beta \left[ \frac{\pi}{\omega_0} + .25 \right] \right] \quad (1)$$

where $0 \leq \beta \leq 1.0$ determines the bandwidth relative to half the sampling rate. The function [x], referred to in Equation (1), is equal to the largest integer less than or equal to x. The $\hat{L}$ spectral amplitudes are denoted by $\hat{M}_l$ for $1 \leq l \leq L$, where $\hat{M}_1$ is the lowest frequency spectral amplitude and $\hat{M}_L$ is the highest frequency spectral amplitude.

The spectral amplitudes for the current speech segment are quantized by first calculating a set of prediction residuals which indicate the amount the spectral amplitudes have changed between the current speech segment and the previous speech segment. If $\hat{L}^0$ denotes the number of spectral amplitudes in the current speech segment and $\hat{L}^{-1}$ denotes the number of spectral amplitudes in the previous speech segment, then the prediction residuals, $\hat{T}_l$ for $1 \leq l \leq \hat{L}^0$ are given by, $$\hat{T}_l = \begin{cases} \log_2 \hat{M}_l^0 - \gamma \cdot \hat{M}_l^{-1} & \text{if } l \leq \hat{L}^{-1} \\ \log_2 \hat{M}_l^0 - \gamma \cdot \hat{M}_{L-1}^{-1} & \text{otherwise} \end{cases} \quad (2)$$

where $\hat{M}_l^0$ denotes the spectral amplitudes of the current speech segment and $\hat{M}_l^{-1}$ denotes the quantized spectral amplitudes of the previous speech segment. The constant $\gamma$ is typically equal to 0.7, however any value in the range $0 \leq \gamma \leq 1$ can be used.

The prediction residuals are divided into blocks of K elements, where the value of K is typically in the range $4 \leq K \leq 12$. If $\hat{L}$ is not evenly divisible by K, then the highest frequency block will contain less than K elements. This is shown in FIG. 2 for $\hat{L}=34$ and $K=8$.

Each of the prediction residual blocks is then transformed using a Discrete Cosine Transform (DCT) defined by, $$X(k) = \frac{1}{J} \sum_{j=0}^{J-1} x(j) \cos\left[ \frac{\pi k(j + \frac{1}{2})}{J} \right] \quad (3)$$

The length of the transform for each block, J, is equal to the number of elements in the block. Therefore, all but the highest frequency block are transformed with a DCT of length K, while the length of the DCT for the highest frequency block is less than or equal to K. Since the DCT is an invertible transform, the $\hat{L}$ DCT coefficients completely specify the spectral amplitude prediction residuals for the current segment.

The total number of bits available for quantizing the spectral amplitude is divided among the DCT coefficients according to a bit allocation rule. This rule attempts to give more bits to the perceptually more important low-frequency blocks, than to the perceptually less important high-frequency blocks. In addition the bit allocation rule divides the bits within a block to the DCT coefficients according to their relative long-term variances. This approach matches the bit allocation with the perceptual characteristics of speech and with the quantization properties of the DCT.

Each DCT coefficient is quantized using the number of bits specified by the bit allocation rule. Typically, uniform quantization is used, however non-uniform or vector quantization can also be used. The step size for each quantizer is determined from the long-term variance of the DCT coefficients and from the number of bits used to quantize each coefficient. Table 1 shows the typical variation in the step size as a function of the number of bits, for a long-term variance equal to $\sigma^2$.

TABLE 1

| Step Size of Uniform Quantizers | |
|---|---|
| Number of Bits | Step Size |
| 1 | $1.2\sigma$ |
| 2 | $.85\sigma$ |
| 3 | $.65\sigma$ |
| 4 | $.42\sigma$ |
| 5 | $.28\sigma$ |
| 6 | $.14\sigma$ |
| 7 | $.07\sigma$ |
| 8 | $.035\sigma$ |
| 9 | $.0175\sigma$ |
| 10 | $.00875\sigma$ |
| 11 | $.00438\sigma$ |
| 12 | $.00219\sigma$ |
| 13 | $.00110\sigma$ |
| 14 | $.000550\sigma$ |
| 15 | $.000275\sigma$ |
| 16 | $.000138\sigma$ |

One each DCT coefficient has been quantized using the number of bits specified by the bit allocation rule, the binary representation can be transmitted, stored, etc., depending on the application. The spectral amplitudes can be reconstructed from the binary representation by first reconstructing the quantized DCT coefficients for each block, performing the inverse DCT on each block, and then combining with the quantized spectral amplitudes of the previous segment using the inverse of Equation (2). The inverse DCT is given by,

TABLE 1

| Step Size of Uniform Quantizers | |
|---|---|
| Number of Bits | Step Size |
| 1 | $1.2\sigma$ |
| 2 | $.85\sigma$ |
| 3 | $.65\sigma$ |
| 4 | $.42\sigma$ |
| 5 | $.28\sigma$ |
| 6 | $.14\sigma$ |
| 7 | $.07\sigma$ |
| 8 | $.035\sigma$ |
| 9 | $.0175\sigma$ |
| 10 | $.00875\sigma$ |
| 11 | $.00438\sigma$ |
| 12 | $.00219\sigma$ |
| 13 | $.00110\sigma$ |
| 14 | $.000550\sigma$ |
| 15 | $.000275\sigma$ |
| 16 | $.000138\sigma$ | where the length, J, for each block is chosen to be the number of elements in that block, $\alpha(j)$ is given by, $$\alpha(j) = \begin{cases} 1 & \text{if } j = 0 \\ 2 & \text{otherwise} \end{cases} \quad (5)$$

One potential problem with the 4800 bps MBE speech coder is that the perceived quality of the reconstructed speech may be significantly reduced if bit errors are added to the binary representation of the MBE model parameters. Since bit errors exits in many speech coder applications, a robust speech coder must be able to correct, detect and/or tolerate bit errors. One technique which has been found to be very successful is to use error correction codes in the binary representation of the model parameters. Error correction codes allow infrequent bit errors to be corrected, and they allow the system to estimate the error rate. The estimate of the error rate can then be used to adaptively process the model parameters to reduce the effect of any remaining bit errors. Typically, the error rate is estimated by counting the number of errors corrected (or detected) by the error correction codes in the current segment, and then using this information to update the current estimate of error rate. For example if each segment contains a (23,12) Golay code which can correct three errors out of the 23 bits, and $\epsilon_T$ denotes the number of errors (0-3) which were corrected in the current segment, then the current estimate of the error rate, $\epsilon_R$, is updated according to:

$$\epsilon_R = \beta \epsilon_R + (1 - \beta)\frac{\epsilon_T}{23} \quad (6)$$

where $\beta$ is a constant in the range $0 \leq \beta \leq 1$ which controls the adaptability of $\epsilon_R$.

SUMMARY OF THE INVENTION

In a first aspect, the invention features an improved method for forming the spectral amplitude prediction residuals from the spectral amplitudes of the current segment and the previous segment. This new method corrects for any change in the fundamental frequency between the two segments. The result is that the prediction residuals have a lower variance, and therefore they can be quantized with less distortion for a given number of bits.

In a second aspect, the invention features an improved method for dividing the prediction residuals into blocks. Instead of fixing the length of each block and then dividing the prediction residuals into a variable number of blocks, the prediction residuals are always divided into a fixed number of blocks and the size of the blocks varies from segment to segment. This new method more closely matches the characteristics of speech, and therefore it allows the prediction residuals to be quantized with less distortion for a given number of bits. In addition it can easily be used with vector quantization to further improve the quantization of the spectral amplitudes.

In a third aspect, the invention features an improved method for quantizing the prediction residuals. The prediction residuals are divided into blocks and then transformed with a DCT, then the first (or D.C.) DCT coefficient from each block is used to form a prediction residual block average (PRBA) vector. This vector is then quantized using a vector quantizer, or it is transformed with a DCT and scalar (or vector) quantized. The advantage of this approach is that it allows the prediction residuals to be quantized with less distortion for a given number of bits.

In a fourth aspect, the invention features a method for reducing the perceptual effects of bit errors. If the measured error rate goes above a predetermined rate, then the voiced/unvoiced decisions are altered to reduce the effect of any potential bit errors. Specifically, any spectral amplitude which is larger than a threshold is declared voiced. This eliminates high energy voiced to unvoiced and unvoiced to voiced transitions in situations where the error rate is high. The perceived effect of this feature is that many large switching distortions are eliminated and the effect of bit errors is reduced.

Other features and advantages of the invention will be apparent from the following description of preferred embodiments and from the claims.

DESCRIPTION OF PREFERRED EMBODIMENTS OF THE INVENTION

In the prior art, the spectral amplitude prediction residuals were formed using Equation (2). This method does not account for any change in the fundamental frequency between the previous segment and current segment. In order to account for the change in the fundamental frequency a new method has been developed which first interpolates the spectral amplitudes of the previous segment. This is typically done using linear interpolation, however various other forms of interpolation could also be used. Then the interpolation spectral amplitudes of the previous segment are resampled at the frequency points corresponding to the multiples of the fundamental frequency of the current segment. This combination of interpolation and resampling produces a set of predicted spectral amplitudes, which have been corrected for any inter-segment change in the fundamental frequency.

Typically a fraction of the base two logarithm of the predicted spectral amplitudes is subtracted from the base two logarithm of the spectral amplitudes of the current segment. If linear interpolation is used to compute the predicted spectral amplitudes, then this can be expressed mathematically as:

$$\hat{T}_l = \log_2 \hat{M}_l{}^0 - \gamma[(1-\delta_l)\log_2 \hat{M}_{kl}{}^{-1} + \delta_l \log_2 \hat{M}_{k+a}{}^{-1}] \quad (7)$$

where $\delta_l$ is given by, $$\delta_l = \frac{\hat{\omega}_0{}^0}{\hat{\omega}_0{}^{-1}} \cdot l - \left\lfloor \frac{\hat{\omega}_0{}^0}{\hat{\omega}_0{}^{-1}} \cdot l \right\rfloor \quad (8)$$

where $\gamma$ is a constant subject to $0 \leq \gamma \leq 1$. Typically, $\gamma = 0.7$, however other values of $\gamma$ can also be used. For example $\gamma$ could be adaptively changed from segment to segment in order to improve performance. The parameters $\hat{\omega}_0^0$ and $\hat{\omega}_l^{-1}$ in Equation (8) refer to the fundamental frequency of the current segment and the previous segment, respectively. In the case where the two fundamental frequencies are the same, the new method is identical to the old method. In other cases the new method produces a prediction residual with lower variance than the old method. This allows the prediction residuals to be quantized with less distortion for a given number of bits.

Figure 1:
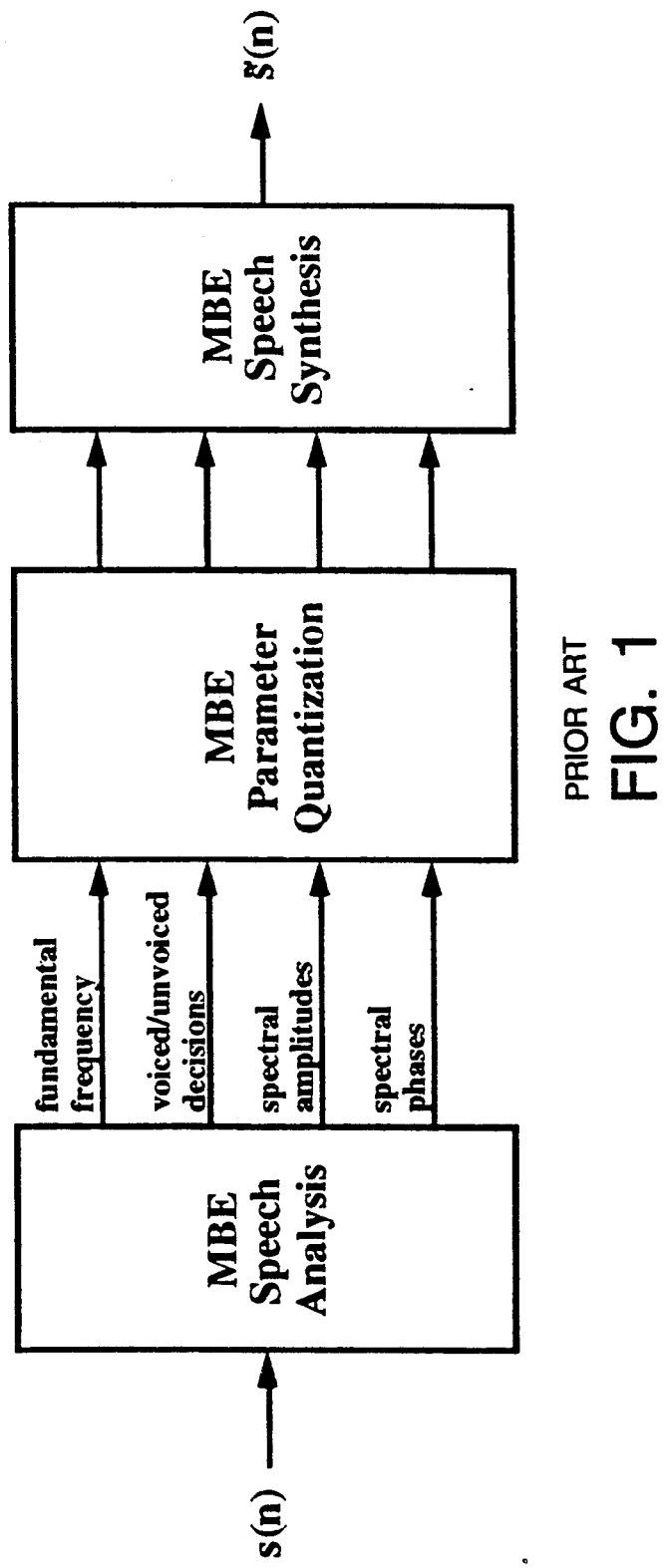
FIGS. 1-2 are diagrams showing prior art speech coding methods.
Figure 2:
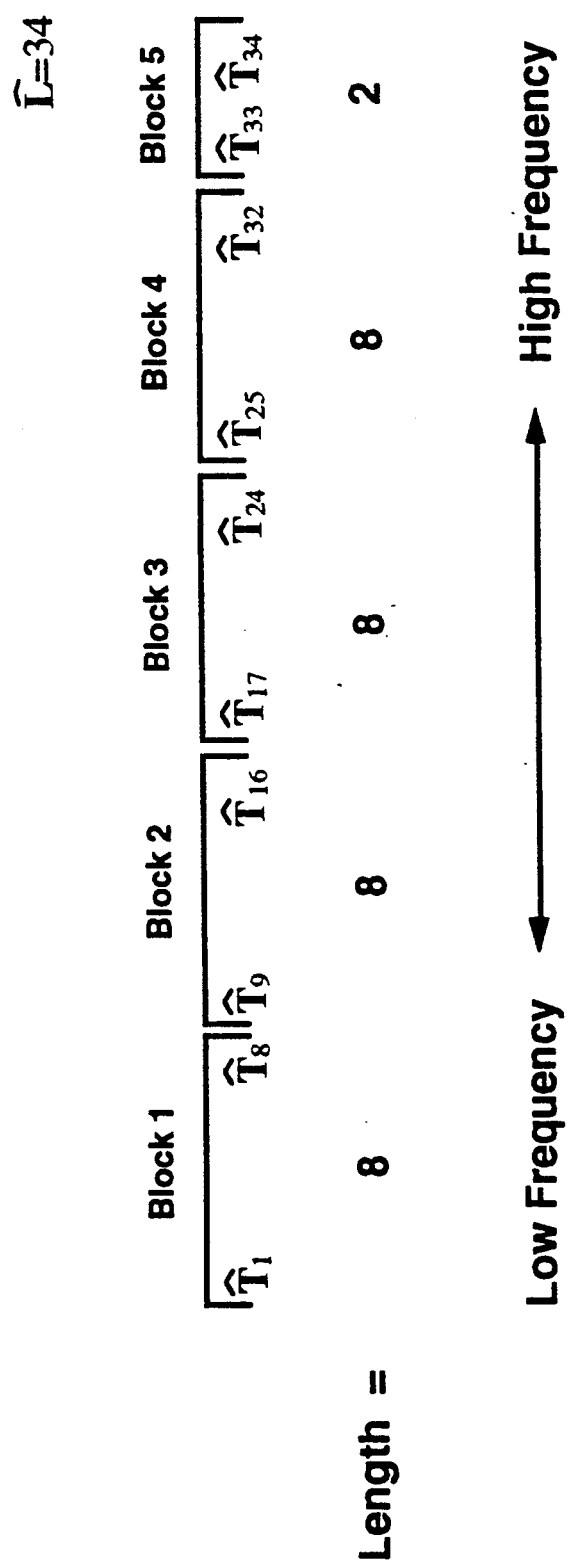
Figure 3:
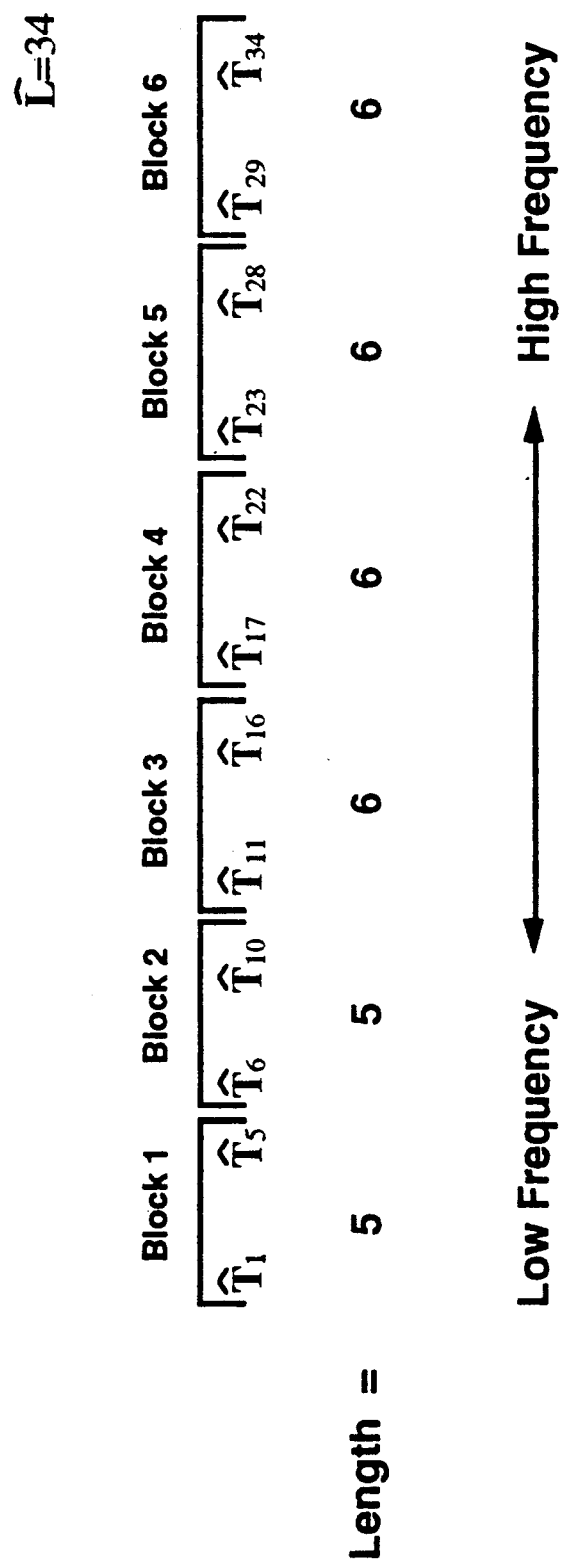
FIG. 3 is a flow chart show in ga preferred embodiment of the invention in which the spectral amplitude prediction accounts for any change in the fundamental frequency.
Figure 4:
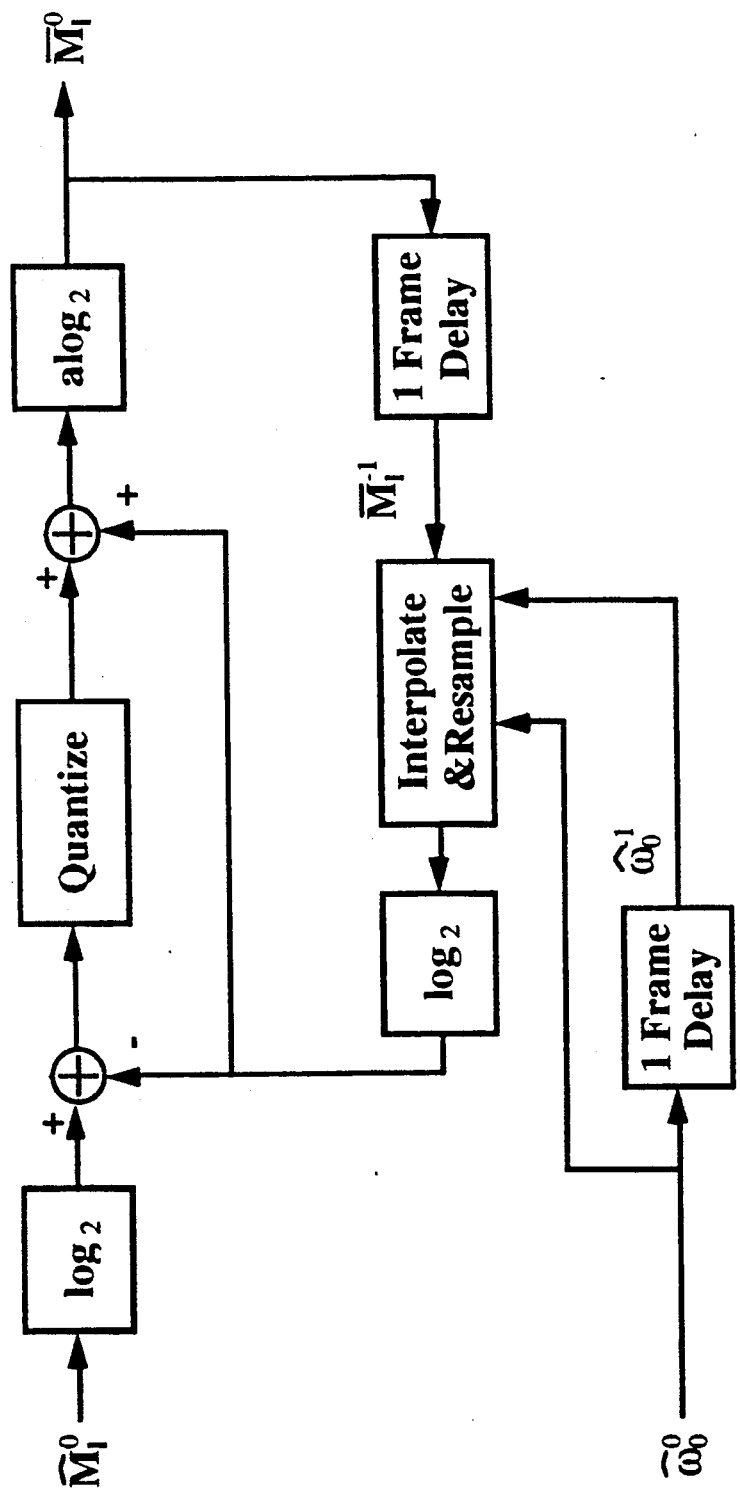
FIG. 4 is a flow chart showing a preferred embodiment of the invention in which the spectral amplitudes are divided into a fixed number of blocks.

In another aspect of the invention a new method has been developed to divide the spectral amplitude prediction residuals into blocks. In the old method the $\hat{L}$ prediction residuals from the current segment were divided into blocks of K elements, where K=8 is a typical value. Using this method, the characteristics of each block were found to be significantly different for large and small values of $\hat{L}$. This reduced the quantization efficiency, thereby increasing the distortion in the spectral amplitudes. In order to make the characteristics of each block more uniform, a new method was devised which divides the $\hat{L}$ prediction residuals into a fixed number of blocks. The length of each block is chosen such that all blocks within a segment have nearly the same length, and the sum of the lengths of all the blocks within a segment equal $\hat{L}$. Typically the total number of prediction residuals is divided into 6 blocks, where the length of each block is equal to $[\frac{\hat{L}}{6}]$. If $\hat{L}$ is not evenly divisible by 6 then the length of one or more higher frequency blocks is increased by one, such that all of the spectral magnitudes are included in one of the six blocks. This new method is shown in FIG. 4 for the case where 6 blocks are used and $\hat{L}=34$. In this new method the approximate percentage of the prediction residuals contained in each block is independent of $\hat{L}$. This reduces the variation in the characteristics of each block, and it allows more efficient quantization of the prediction residuals.

Figure 5:
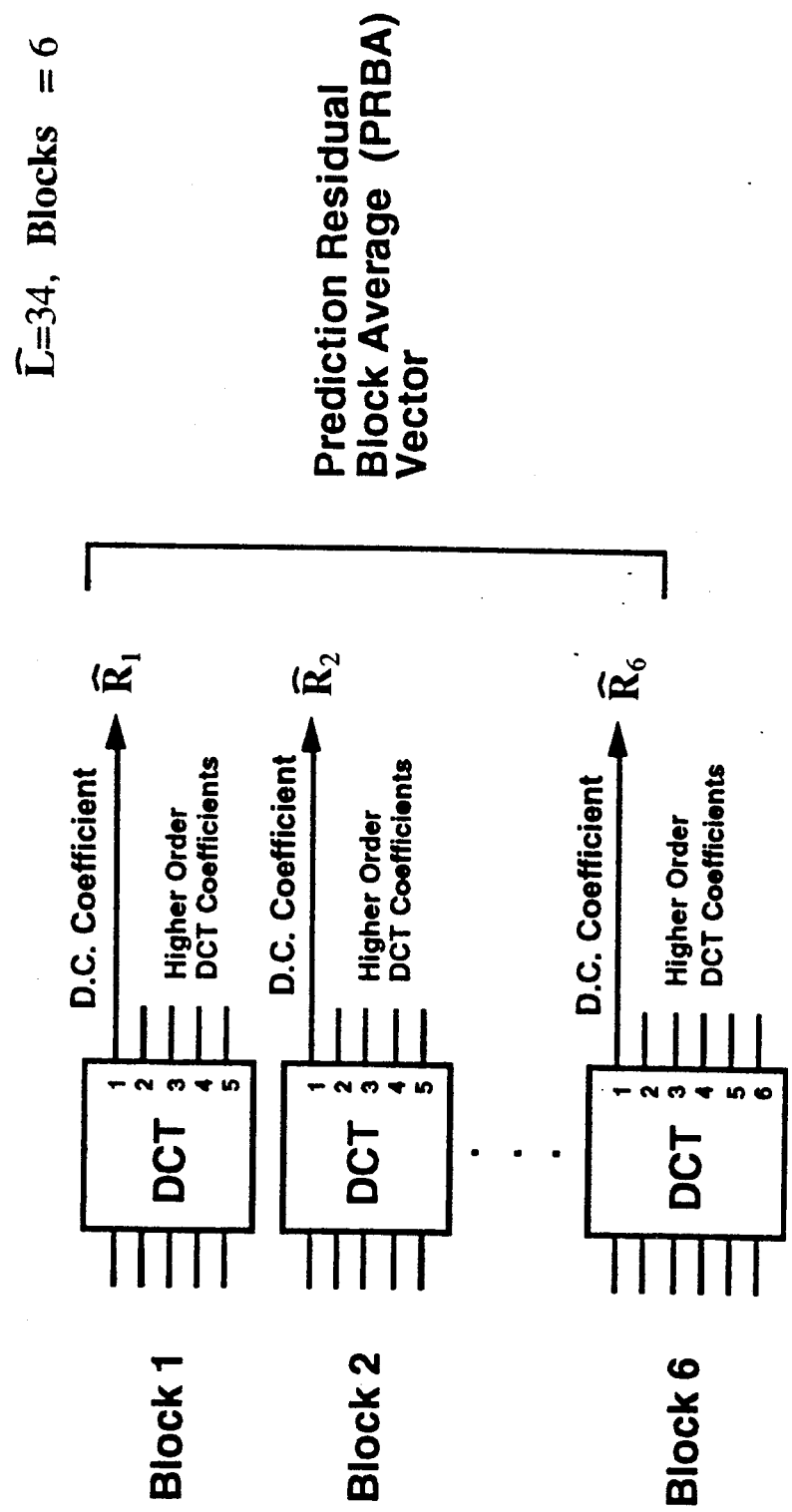
FIG. 5 is a flow chart showing a preferred embodiment of the invention in which a prediction residual block average vector is formed.

The quantization of the prediction residuals can be further improved by forming a prediction residual block average (PRBA) vector. The length of the PRBA vector is equal to the number of blocks in the current segment. The elements of this vector correspond to the average of the prediction residuals within each block. Since the first DCT coefficient is equal to the average (or D.C. value), the PRBA vector can be formed from the first DCT coefficient from each block. This is shown in FIG. 5 for the case where 6 blocks are present in the current segment and $\hat{L}=34$. This process can be generalized by forming additional vectors from the second (or third, fourth, etc.) DCT coefficient from each block.

Figure 6:
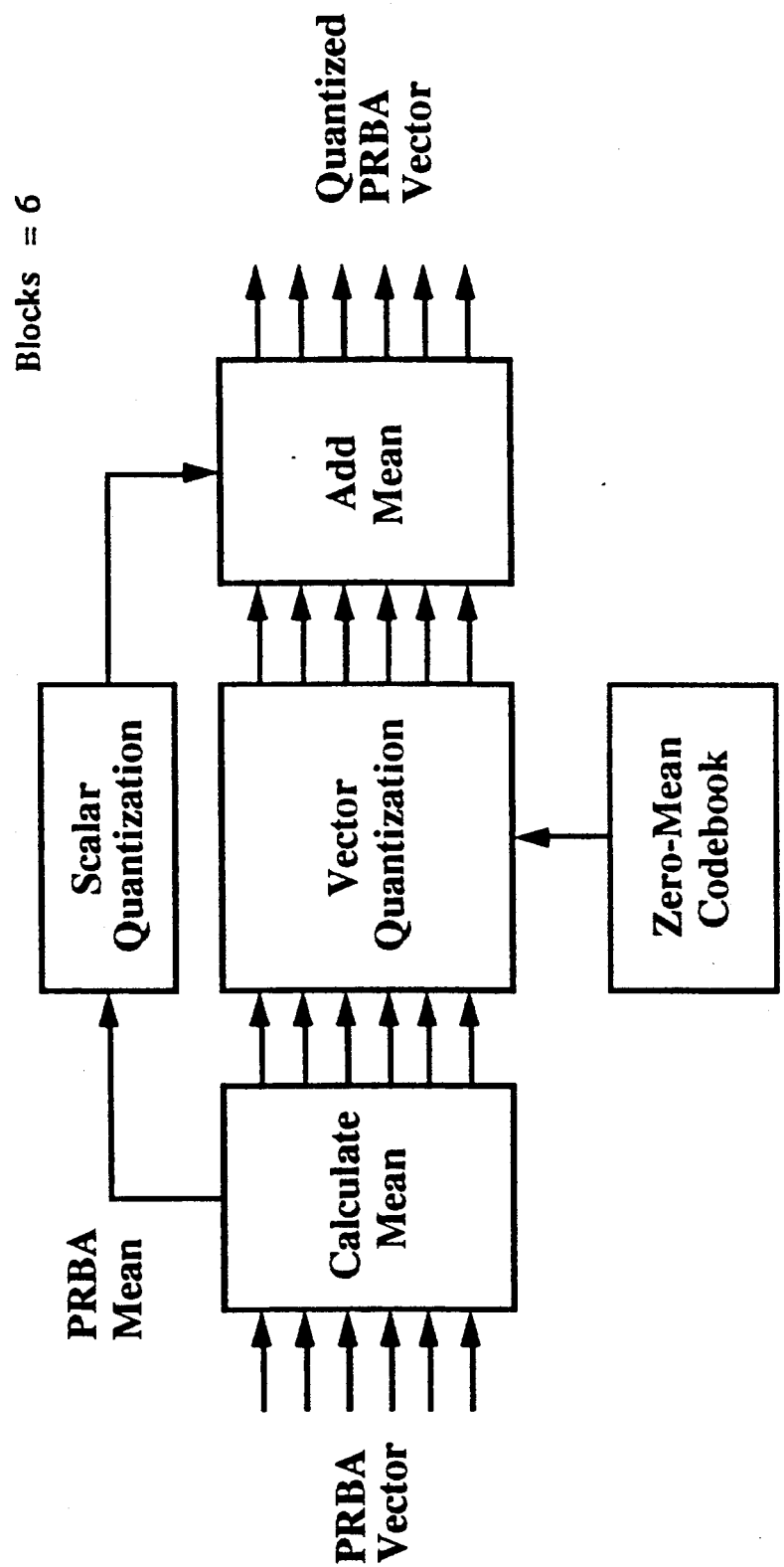
FIG. 6 is a flow chart showing a preferred embodiment of the invention in which the prediction residual block average vector is vector quantized.

The elements of the PRBA vector or highly correlated. Therefore a number of methods can be used to improved the quantization of the spectral amplitudes. One method which can be used to achieve very low distortion with a small number of bits is vector quantization. In this method a codebook is designed which contains a number of typical PRBA vectors. The PRBA vector for the current segment is compared against each of the codebook vectors, and the one with the lowest error is chosen as the quantize PRBA vector. The codebook index of the chosen vector is used to form the binary representation of the PRBA vector. A method for performing vector quantization of the PRBA vector has been developed which uses the cascade of a 6 bit non-uniform quantizer for the mean of the vector and a 10 bit vector quantizer for the remaining information. This method is shown in FIG. 6 for the case where the PRBA vector always contains 6 elements.

Figure 7:
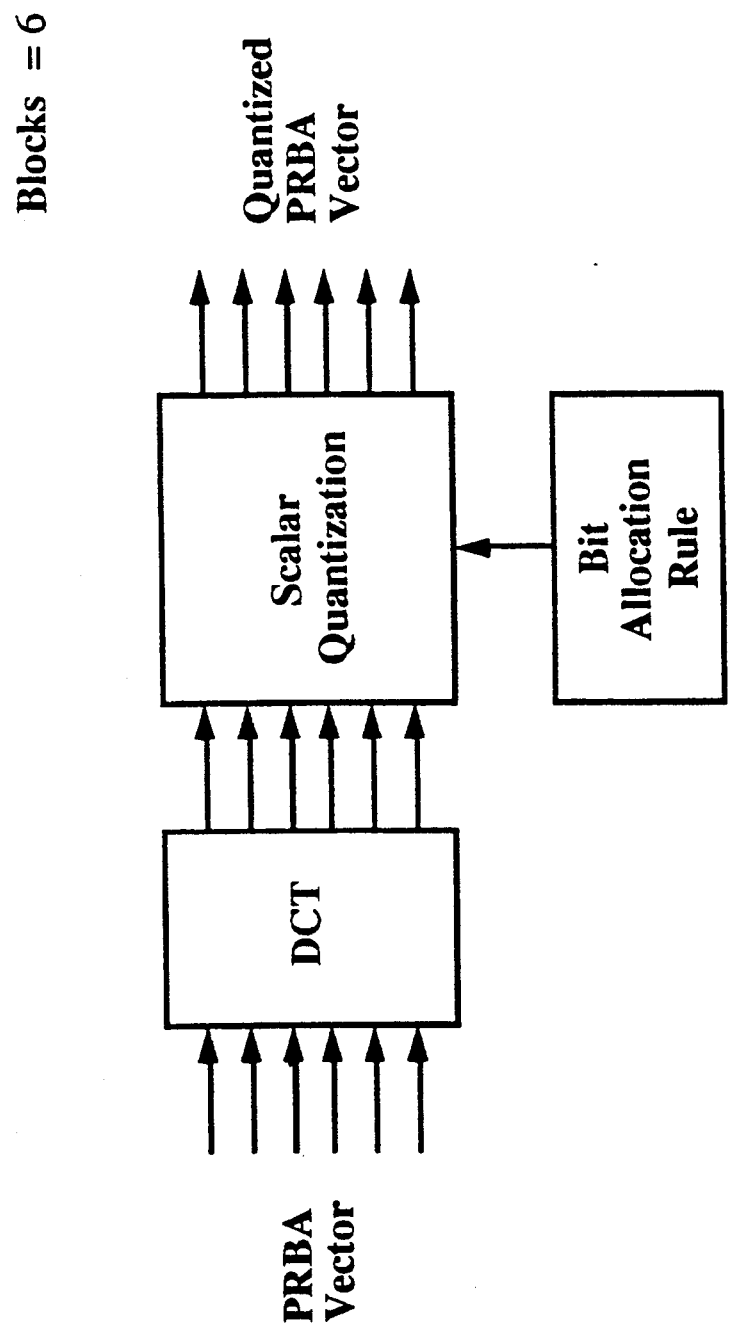
FIG. 7 is a flow chart showing a preferred embodiment of the invention in which the prediction residual block average vector is quantized with a DCT and scalar quantization.

An alternative method for quantizing the PRBA vector has also been developed. This method requires less computation and storage than the vector quantization method. In this method the PRBA vector is first transformed with a DCT as defined in Equation (3). The length of the DCT is equal to the number of elements in the PRBA vector. The DCT coefficients are then quantized in a manner similar to that discussed in the prior art. First a bit allocation rule is used to distribute the total number of bits used to quantize the PRBA vector among the DCT coefficients. Scalar quantization (either uniform or non-uniform) is then used to quantize each DCT coefficient using the number of bits specified by the bit allocation rule. This is shown in FIG. 7 for the case where the PRBA vector always contains 6 elements.

Various other methods can be used to efficiently quantize the PRBA vector. For example other transforms such as the Discrete Fourier Transform, the Fast Fourier Transform, the Karhunen-Lourve Transform could be used instead of the DCT. In addition vector quantization can be combined with the DCT or other transform. The improvements derived from this aspect of the invention can be used with a wide variety of quantization methods.

In another aspect a new method for reducing the perceptual effect of bit errors has been developed. Error correction codes are used as in the prior art to correct infrequent bit errors and to provide an estimate of the error rate $\epsilon_R$. The new method uses the estimate of the error rate to smooth the voiced/unvoiced decisions, in order to reduce the perceived effect of any remaining bit errors. This is done by first comparing the error rate against a threshold which signifies the rate at which the distortion from uncorrected bit errors in the voiced/unvoiced decisions is significant. The exact value of this threshold depends on the amount of error correction applied to the voiced/unvoiced decisions, but a threshold value of 0.003 is typical if little error correction has been applied. If the estimated error rate, $\epsilon_R$, is below this threshold then the voiced/unvoiced decisions are not perturbed. If $\epsilon_R$ is above this threshold then every spectral amplitude for which Equation (9) is satisfied is declared voiced.

$$M_l > \begin{cases} \dfrac{45.255(S_E)^{.375}}{\exp(173.29\epsilon_R)} & \text{if } .003 < \epsilon_R \leq .02 \\ 1.414(S_E)^{.375} & \text{if } \epsilon_R > .02 \end{cases} \quad (9)$$

Although Equation (9) assumes a threshold value of 0.003, this method can easily be modified to accommodate other thresholds. The parameter $S_E$ is a measure of the local average energy contained in the spectral amplitudes. This parameter is typically updated each segment according to:

$$S_E = \begin{cases} .95S_E + 0.5R_0 & \text{if } .95S_E + .05R_0 \leq 10000.0 \\ 10000.0 & \text{otherwise} \end{cases} \quad (10)$$

where $R_0$ is given by, $$R_0 = \sum_{l=1}^{\hat{L}} \hat{M}_l^2 \qquad (11)$$

The initial value of $S_E$ is set to an arbitrary initial value in the range $0 \leq S_E \leq 10000.0$. The purpose of this parameter is to reduce the dependency of Equation (9) on the average signal level. This ensures that the new method works as well for low level signals as it does for high level signals.

The specific forms of Equations (9), (10) and (11) and the constants contained within them can easily be modified, while maintaining the essential components of the new method. The main components of this new method are to first use an estimate of the error rate to determine whether the voiced/unvoiced decisions need to be smoothed. Then if smoothing is required, the voiced/unvoiced decisions are perturbed such that all high energy spectral amplitudes are declared voiced. This eliminates any high energy voiced to unvoiced or unvoiced to voiced transitions between segments, and as a result it improves the perceived quality of the reconstructed speech in the presence of bit errors.

We claim:

1. A method of encoding a speech signal, the method comprising the steps:
   breaking said signal into segments, each of said segments representing one of a succession of time intervals and having a spectrum of frequencies;
   for each said segment, sampling said spectrum at a set of frequencies, thereby forming a set of actual spectral amplitudes, wherein the frequencies at which said spectra are sampled generally differ from one segment to the next;
   producing predicted spectral amplitudes for said current segment based on the spectral amplitudes for at least one previous segment, wherein said predicted spectral amplitudes for said current segment are based at least in part on interpolating the spectral amplitudes of a previous segment to estimate the spectral amplitudes in the previous segment at the frequencies of said current segment;
   producing prediction residuals based on a difference between the actual spectral amplitudes for said current segment and the predicted spectral amplitudes for said current segment; and
   producing an encoded speech signal based on said prediction residuals.

2. The method of claim 1 wherein said interpolating of spectral amplitudes is performed using linear interpolation.

3. A method of encoding a speech signal, the method comprising the steps:
   breaking said signal into segments, each of said segments representing one of a succession of time intervals and having a spectrum of frequencies;
   for each said segment, sampling said spectrum at a set of frequencies, thereby forming a set of spectral amplitudes, wherein the frequencies at which said spectra are sampled generally differ from one segment to the next;
   producing predicted spectral amplitudes for said current segment based on the spectral amplitudes for at least one previous segment;
   producing prediction residuals based on a difference between the actual spectral amplitudes for said current segment and the predicted spectral amplitudes for said current segment;
   grouping said prediction residuals into a predetermined number of blocks, the number of blocks being independent of the number of said prediction residuals grouped into particular blocks; and
   producing an encoded speech signal based on said blocks.

4. The method of claim 3 wherein said predicted spectral amplitudes for said current segment are based at lest in part on interpolating the spectral amplitudes of a previous segment to estimate the spectral amplitudes in the previous segment at the frequencies of said current segment.

5. A method of encoding a speech signal, the method comprising the steps:
   breaking said signal into segments, each of said segments representing one of a succession of time intervals and having a spectrum of frequencies;
   for each said segment, sampling said spectrum at a set of frequencies, thereby forming a set of spectral amplitudes, wherein the frequencies at which the spectra are sampled generally differ from one segment to the next;
   producing predicted spectral amplitudes for said current segment based on the spectral amplitudes for at least one previous segment;
   producing prediction residuals based on a difference between the actual spectral amplitudes for said current segment and the predicted spectral amplitudes for said current segment;
   grouping said prediction residuals into blocks;
   forming a prediction residual block average (PRBA) vector, each value of said PRBA vector being an average of the prediction residuals of a corresponding block; and
   producing an encoded speech signal based on said PRBA.

6. The method of claim 5 wherein said blocks are of a predetermined number, the number of blocks being independent of the number of said prediction residuals grouped into particular blocks.

7. The method of claim 6 wherein the predicted spectral amplitudes for said current segment are based at least in part on interpolating the spectral amplitudes of a previous segment to estimate the spectral amplitudes in the previous segment at the frequencies of said current segment.

8. The method of claim 5, 6 or 7 wherein said average is computed by adding the prediction residuals within the block and dividing by the number of prediction residuals grouped into that block.

9. The method of claim 8 wherein said average is obtained by computing the coefficients of a Discrete Cosine Transform (DCT) of the prediction residuals within a block and using the fist coefficient of the DCT as said average.

10. The method of claim 5, 6 or 7 wherein encoding said PRBA vector comprises performing a linear transform on the PRBA vector producing transform coefficients and scalar quantizing said transform coefficients.

11. The method of claim 10 wherein said linear transform comprises a Discrete Cosine Transform.

12. The method of claim 5, 6 or 7 wherein encoding said PRBA vector comprises vector quantizing said PRBA vector.

13. The method of claims 5, 6 or 7 wherein encoding said PRBA vector is performed using a method comprising the steps of:

determining an average of said PRBA vector;

quantizing said average using scalar quantization; and vector quantizing said PRBA vector using a codebook consisting of code vectors, each of said code vectors having a mean equal to zero.

14. The method of claim 3, 6 or 7 wherein said predetermined number is equal to six.

15. The method of claim 14 wherein the difference between the number of sampled frequencies grouped into the highest frequency block and the number of sampled frequencies grouped into the lowest frequency block is less than or equal to one.

16. The method of claim 3, 6 or 7 wherein the number of prediction residuals grouped into a lower frequency block is not larger than the number of prediction residuals grouped into a higher frequency block.

17. The method of claim 1, 3, or 5 wherein said difference between the actual spectral amplitudes for said current segment and the predicted spectral amplitudes for said current segment is formed by subtracting a fraction of the predicted spectral amplitudes from the actual spectral amplitudes.

18. The method of claim 1, 3 or 5 wherein the spectral amplitudes are obtained using a Multiband Excitation speech model.

19. The method of claim 1, 3 or 5 wherein the spectral amplitudes are obtained using sinusoidal transform coding.

20. The method of claim 1, 3 or 5 wherein only spectral amplitudes from the most recent previous segment are used in forming the predicted spectral amplitudes of said current segment.

21. The method of claim 1, 3 or 5 wherein said spectrum comprises a fundamental frequency and said set of frequencies for a given segment are multiples of said fundamental frequency.

22. A method of synthesizing speech from a received bit stream, said bit stream representing speech segments and having bit errors, the method comprising the steps of:

estimating a bit error rate for each speech segment;

for each said speech segment, deciding whether to decode said speech segment as a voided or an unvoiced speech segment;

smoothing the voice/unvoiced decisions based on the estimate of the bit error rate for said speech segment; and synthesizing a speech signal using said smoothed voiced/unvoiced decisions.

23. A method of synthesizing speech from a received bit stream, said bit stream representing frequency bands of speech segments and having bit errors, the method comprising the steps of:

estimating a bit error rate for each speech segment;

for each frequency band of each said speech segment, deciding whether to decode the frequency band of said speech segment as voiced or unvoiced;

smoothing the voiced/unvoiced decisions based on the estimated of the bit error rate for said speech segment; and synthesizing a speech signal using said method voiced/unvoiced decisions.

24. The method of claims 22 or 23 wherein the smoothing step comprises the steps of:

comparing the estimate of the bit error rate of said speech segment with a first predetermined threshold;

declaring all high energy spectral amplitudes voiced when said bit error rate is above said first threshold; and leaving all other voiced/unvoiced decisions unaffected.

25. The method of claim 24 wherein said high energy spectral amplitudes are determined by a method comprising the steps of:

for each said speech segment, computing a second threshold which depends on the estimate of the bit error rate for said segment;

comparing each spectral amplitude with said second threshold; and determining the spectral amplitude to be high energy if it is greater than said second threshold.

* * * * *

UNITED STATES PATENT AND TRADEMARK OFFICE
CERTIFICATE OF CORRECTION

PATENT NO. : 5,226,084

DATED : July 6, 1993

INVENTOR(S) : John C. Hardwick and Jae S. Lim

It is certified that error appears in the above-identified patent and that said Letters Patent is hereby corrected as shown below:

Column 1, line 61, "vocodes" should be --vocoders--.

Column 2, line 26, "codes" should be --coders--.

Column 2, line 41, "characterized" should be --characterize--.

Column 3, Equation (1)," $\hat{L} = \left\lfloor \beta \left\lfloor \frac{\pi}{\omega_0} + .25 \right\rfloor \right\rfloor$ " should be -- $\hat{L} = \left\lfloor \beta \left\lfloor \frac{\pi}{\hat{\omega}_0} + .25 \right\rfloor \right\rfloor$ --.

Column 3, line 13, " $1 \leq 1 \leq L$ " should be -- $1 \leq 1 \leq \hat{L}$ --.

Column 3, line 14, " $\hat{M}_L$ " should be -- $\hat{M}_{\hat{L}}$ --.

UNITED STATES PATENT AND TRADEMARK OFFICE
CERTIFICATE OF CORRECTION

PATENT NO.    : 5,226,084

DATED         : July 6, 1993

INVENTOR(S)   : John C. Hardwick and Jae S. Lim

It is certified that error appears in the above-identified patent and that said Letters Patent is hereby corrected as shown below:

Column 3, line 59, "amplitude" should be --amplitudes--.

Column 4, delete the second occurrence of Table 1, and insert the following --

$$X(k) = \sum_{j=0}^{j-1} \alpha(j) X(j) \cos\left[\frac{\pi j (k + \frac{1}{2})}{J}\right] \quad (4)$$ --.

Column 4, line 68, "exits" should be --exist--.

Column 6, line 11, "show in ga" should be --showing a--.

Column 6, line 41, "interpolation" should be --interpolated--.

Column 7, line 1, " $\omega_I^{-1}$ " should be -- $\omega_0^{-1}$ --.

Column 7, line 27, " $[_6\hat{L}]$ " should be -- $\left\lfloor \frac{\hat{L}}{6} \right\rfloor$ --.

Column 8, line 23, "Karhunen-Lourve" should be --Karhunen-Louve--.

UNITED STATES PATENT AND TRADEMARK OFFICE
CERTIFICATE OF CORRECTION

PATENT NO.  : 5,226,084

DATED       : July 6, 1993

INVENTOR(S) : John C. Hardwick and Jae S. Lim

It is certified that error appears in the above-identified patent and that said Letters Patent is hereby corrected as shown below:

Column 8, Equation (9),

" $M_1 > \begin{cases} \dfrac{45.255(S_E)^{.375}}{\exp(173.29\epsilon_R)} & \text{if } .003 < \epsilon_R \leq .02 \\ 1.414(S_E)^{.375} & \text{if } \epsilon_R > .02 \end{cases}$ " should be -- $\tilde{M}_1 > \begin{cases} \dfrac{45.255(S_E)^{.375}}{\exp(173.29\epsilon_R)} & \text{if } .003 < \epsilon_R \leq .02 \\ 1.414(S_E)^{.375} & \text{if } \epsilon_R > .02 \end{cases}$ --.

Column 10, line 11, "lest" should be --least--.

Column 10, line 57, "fist" should be --first--.

Column 12, line 3, "voided" should be --voiced--.

Column 12, line 5, "voice" should be --voiced--.

UNITED STATES PATENT AND TRADEMARK OFFICE
CERTIFICATE OF CORRECTION

PATENT NO. : 5,226,084

DATED : July 6, 1993

INVENTOR(S) : John C. Hardwick and Jae S. Lim

It is certified that error appears in the above-identified patent and that said Letters Patent is hereby corrected as shown below:

Column 12, line 19, "estimated" should be --estimate--.

Signed and Sealed this

Seventeenth Day of May, 1994

Attest:

BRUCE LEHMAN

Attesting Officer — Commissioner of Patents and Trademarks